United States Patent
Chu et al.

(10) Patent No.: US 7,791,882 B2
(45) Date of Patent: Sep. 7, 2010

(54) ENERGY EFFICIENT APPARATUS AND METHOD FOR COOLING AN ELECTRONICS RACK

(75) Inventors: Richard C. Chu, Hopewell Junction, NY (US); Madhusudan K. Iyengar, Woodstock, NY (US); Vinod Kamath, Raleigh, NC (US); Roger R. Schmidt, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 168 days.

(21) Appl. No.: 12/108,020

(22) Filed: Apr. 23, 2008

(65) Prior Publication Data

US 2009/0268404 A1  Oct. 29, 2009

(51) Int. Cl.
- *H05K 7/20* (2006.01)
- *G06F 1/20* (2006.01)
- *G05D 23/00* (2006.01)

(52) U.S. Cl. ............. 361/698; 361/679.47; 361/679.48; 361/679.53; 361/695; 361/696; 361/699; 361/701; 361/702; 62/259.2; 165/104.33; 700/300

(58) Field of Classification Search ......... 361/694–696, 361/698–699, 701–702, 704; 165/80.2–80.4, 165/104.33, 185; 62/259.2; 700/299–300
See application file for complete search history.

(56) References Cited

U.S. PATENT DOCUMENTS

| | | | |
|---|---|---|---|
| 5,056,331 A | 10/1991 | Lotz | |
| 5,777,897 A * | 7/1998 | Giorgio | 700/299 |
| 6,574,104 B2 | 6/2003 | Patel et al. | |
| 6,745,579 B2 | 6/2004 | Spinazzola et al. | |
| 6,746,212 B2 | 6/2004 | Payne | |
| 6,775,137 B2 * | 8/2004 | Chu et al. | 361/696 |
| 6,775,997 B2 | 8/2004 | Bash et al. | |
| 6,826,922 B2 | 12/2004 | Patel et al. | |
| 6,896,612 B1 | 5/2005 | Novotny | |

(Continued)

OTHER PUBLICATIONS

Campbell et al., "Methods for Configuring Tubing for Interconnecting In-Series Multiple Liquid-Cooled Cold Plates", U.S. Appl. No. 11/620,088, filed Jan. 5, 2007.

(Continued)

*Primary Examiner*—Jayprakash N Gandhi
*Assistant Examiner*—Robert J Hoffberg
(74) *Attorney, Agent, or Firm*—Geraldine Monteleone, Esq.; Kevin P. Radigan, Esq.; Heslin Rothenberg Farley & Mesiti P.C.

(57) ABSTRACT

Apparatus and method are provided for cooling an electronics rack in an energy efficient, dynamic manner. The apparatus includes one or more extraction mechanisms for facilitating cooling of the electronics rack, an enclosure, a heat removal unit, and a control unit. The enclosure has an outer wall, a cover coupled to the outer wall and a central opening sized to surround the electronics rack and the heat extraction mechanism. A liquid coolant loop couples the heat removal unit in fluid communication with the heat extraction mechanism, which removes heat from liquid coolant passing therethrough. The control unit is coupled to the heat removal unit for dynamically adjusting energy consumption of the heat removal unit to limit its energy consumption, while providing a required cooling to the electronics rack employing the liquid coolant passing through the heat extraction mechanism.

20 Claims, 11 Drawing Sheets

U.S. PATENT DOCUMENTS

| | | |
|---|---|---|
| 6,924,981 B2 | 8/2005 | Chu et al. |
| 7,011,143 B2 * | 3/2006 | Corrado et al. ............ 165/80.4 |
| 7,024,573 B2 * | 4/2006 | Patel et al. ................. 713/324 |
| 7,104,081 B2 | 9/2006 | Chu et al. |
| 7,120,021 B2 | 10/2006 | Hamman |
| 7,203,063 B2 | 4/2007 | Bash et al. |
| 7,349,213 B2 | 3/2008 | Campbell et al. |
| 7,372,698 B1 * | 5/2008 | Tilton et al. ................. 361/701 |
| 7,373,268 B1 * | 5/2008 | Viredaz et al. .............. 702/130 |
| 7,455,103 B2 * | 11/2008 | Sato et al. ................... 165/299 |
| 2005/0023363 A1 | 2/2005 | Sharma et al. |
| 2005/0225936 A1 | 10/2005 | Day |
| 2005/0235671 A1 | 10/2005 | Belady et al. |
| 2005/0237716 A1 | 10/2005 | Chu et al. |
| 2006/0126296 A1 | 6/2006 | Campbell et al. |
| 2006/0232945 A1 | 10/2006 | Chu et al. |
| 2006/0250770 A1 | 11/2006 | Campbell et al. |
| 2007/0019380 A1 | 1/2007 | Campbell et al. |
| 2007/0213881 A1 * | 9/2007 | Belady et al. ............... 700/300 |
| 2008/0018212 A1 * | 1/2008 | Spearing et al. ............. 312/236 |
| 2008/0304236 A1 * | 12/2008 | Murakami et al. .......... 361/699 |
| 2009/0150129 A1 * | 6/2009 | Archibald et al. ............... 703/5 |
| 2009/0207567 A1 * | 8/2009 | Campbell et al. ........... 361/696 |
| 2009/0223234 A1 * | 9/2009 | Campbell et al. ............. 62/127 |

OTHER PUBLICATIONS

Campbell et al., "System and Method of Facilitating Cooling of Electronics Racks of a Data Center Employing Multiple Cooling Stations", U.S. Appl. No. 11/744,269, filed May 4, 2007.

Campbell et al., "Docking Station with Closed Loop Airflow Path for Facilitating Cooling of an Electronics Rack", U.S. Appl. No. 11/862,328, field Sep. 27, 2007.

Campbell et al., "Docking Station with Hybrid Air and Liquid Cooling of an Electronics Rack", U.S. Appl. No. 11/862,346, filed Sep. 27, 2007.

Campbell et al., "Method and Air-Cooling Unit with Dynamic Airflow and Heat Removal Adjustability", U.S. Appl. No. 12/031,961, filed Feb. 15, 2008.

* cited by examiner

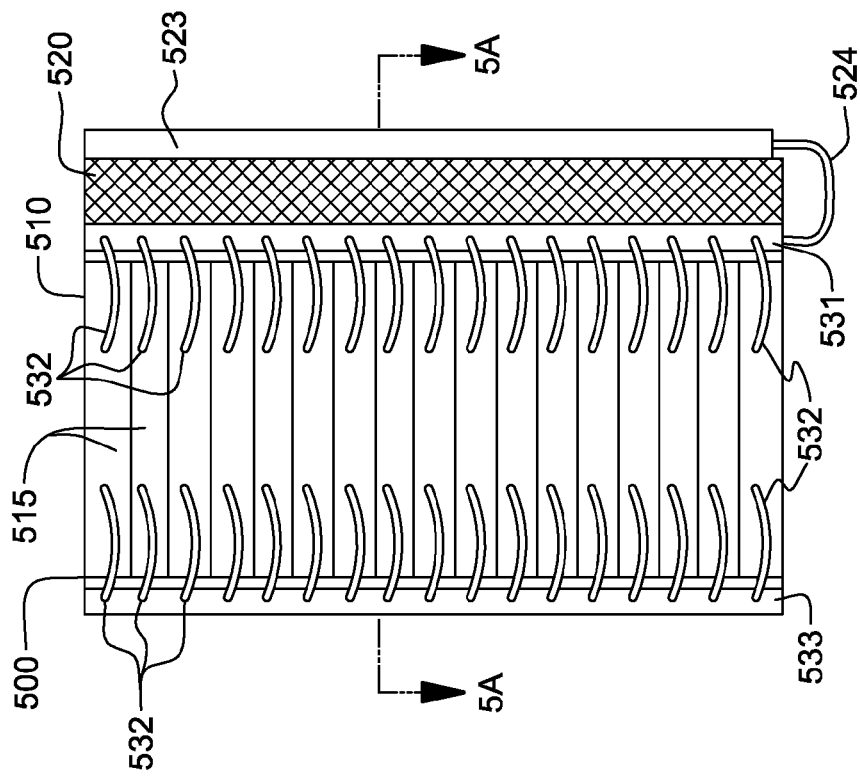
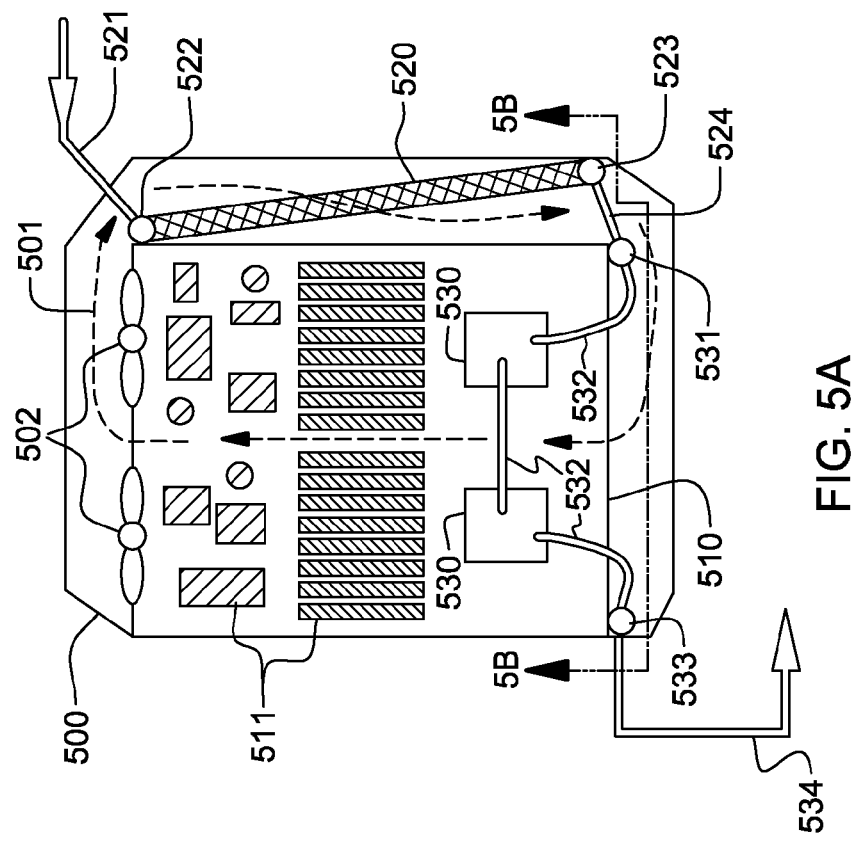

ENERGY EFFICIENT APPARATUS AND METHOD FOR COOLING AN ELECTRONICS RACK

TECHNICAL FIELD

The present invention relates in general to apparatuses and methods for cooling rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center)

The sensible heat load carried by the air exiting the rack is stressing the ability of the room air-conditioning to effectively handle the load. This is especially true for large installations with "server farms" or large banks of electronics racks close together. Further, studies have recently shown that approximately 1% of total energy consumption in the world is attributable to electronics racks, or server-driven power usage, and report a doubling of electronics rack related electricity consumption between 2000 and 2005. Thus, improving energy efficiency of a data center installation is important from a sustainability perspective, an energy consumption perspective and a cost perspective.

SUMMARY OF THE INVENTION

The shortcomings of the prior art are overcome and additional advantages are provided through the provision of an apparatus for cooling of an electronics rack. The apparatus includes: at least one heat extraction mechanism for facilitating cooling of the electronics rack; an enclosure comprising at least one wall, a cover coupled to the at least one wall, and a central opening sized to accommodate the electronics rack and the at least one heat extraction mechanism therein, wherein when operatively employed, the enclosure surrounds the electronics rack and facilitates establishing a closed loop airflow path therein passing through the electronics rack; a heat removal unit in fluid communication with the at least one heat extraction mechanism for removing heat from liquid coolant passing therethrough, the at least one heat extraction mechanism and the heat removal unit being coupled via a liquid coolant loop; and a control unit coupled to the heat removal unit for dynamically adjusting energy consumption of the heat removal unit to limit energy consumption thereof, while providing a required cooling to the electronics rack employing the liquid coolant passing through the at least one heat extraction mechanism.

In another aspect, a method for facilitating cooling of an electronics rack is provided. The method includes: providing at least one heat extraction mechanism for facilitating cooling of an electronics rack disposed within an enclosure, wherein the enclosure facilitates establishing a closed loop airflow path within the enclosure passing through the electronics rack; providing a heat removal unit in fluid communication with the at least one heat extraction mechanism for removing heat from liquid coolant passing therethrough, the at least one heat extraction mechanism and the heat removal unit being coupled via a liquid coolant loop; and providing a control unit to automatically adjust liquid coolant flow rate through the at least one heat extraction mechanism, the control unit automatically dynamically adjusting energy consumption of the heat removal unit to limit energy consumption thereof, while providing a required cooling to the electronics rack employing the liquid coolant passing through the at least one heat extraction mechanism.

In a further aspect, a method for cooling an electronics rack is provided. The method includes: passing liquid coolant through at least one heat extraction mechanism disposed within an enclosure containing an electronics rack for facilitating cooling of the electronics rack, wherein the enclosure surrounds the electronics rack and facilitates establishing a closed loop airflow path therein passing through the electronics rack; and dynamically adjusting energy consumption of a heat removal unit coupled in fluid communication with the at least one heat extraction mechanism via a liquid coolant loop, the heat removal unit removing heat from liquid coolant passing therethrough, wherein the dynamically adjusting includes dynamically adjusting at least one of liquid coolant flow rate through the at least one heat extraction mechanism or airflow rate across at least one liquid-to-air heat exchanger of the heat removal unit, the at least one liquid-to-air heat exchanger of the heat removal unit facilitating removal of heat from the liquid coolant, and wherein the heat removal unit is disposed external to the enclosure.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5A is a plan view of the structure of FIG. 5B, viewed along line 5A-5A thereof, and illustrating a partial embodiment of an electronics rack and an apparatus for cooling the electronics rack, in accordance with an aspect of the present invention;

FIG. 5B is an elevational view of the apparatus and rack of FIG. 5A, viewed along line 5B-5B thereof, in accordance with an aspect of the present invention;

DETAILED DESCRIPTION OF THE INVENTION

As used herein, the terms "electronics rack", "rack-mounted electronic equipment", and "server rack" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics drawers or nodes each having one or more heat generating components disposed therein requiring cooling. Further, as used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. The term "liquid-to-air heat exchanger" means any heat exchanger such as described above, wherein heated liquid coolant is passed through the heat exchanger and heat is exhausted from the liquid coolant to air passing across the heat exchanger. Further, "data center" refers to a computer installation containing one or more electronics racks to be cooled. As a specific example, a data center may include one or more rows of rack-mounted computing units, such as server units.

One example of the liquid coolant discussed herein is water. However, the concepts disclosed herein are readily adapted to use with other types of coolant. For example, one or more of the coolants may comprise a brine, a fluorocarbon liquid, a liquid metal, or other similar coolant, or refrigerant, while still maintaining the advantages and unique features of the present invention.

Reference is made below to the drawings, which are not drawn to scale to facilitate understanding, and wherein the same reference numbers used throughout different figures designate the same or similar components.

Figure 1:
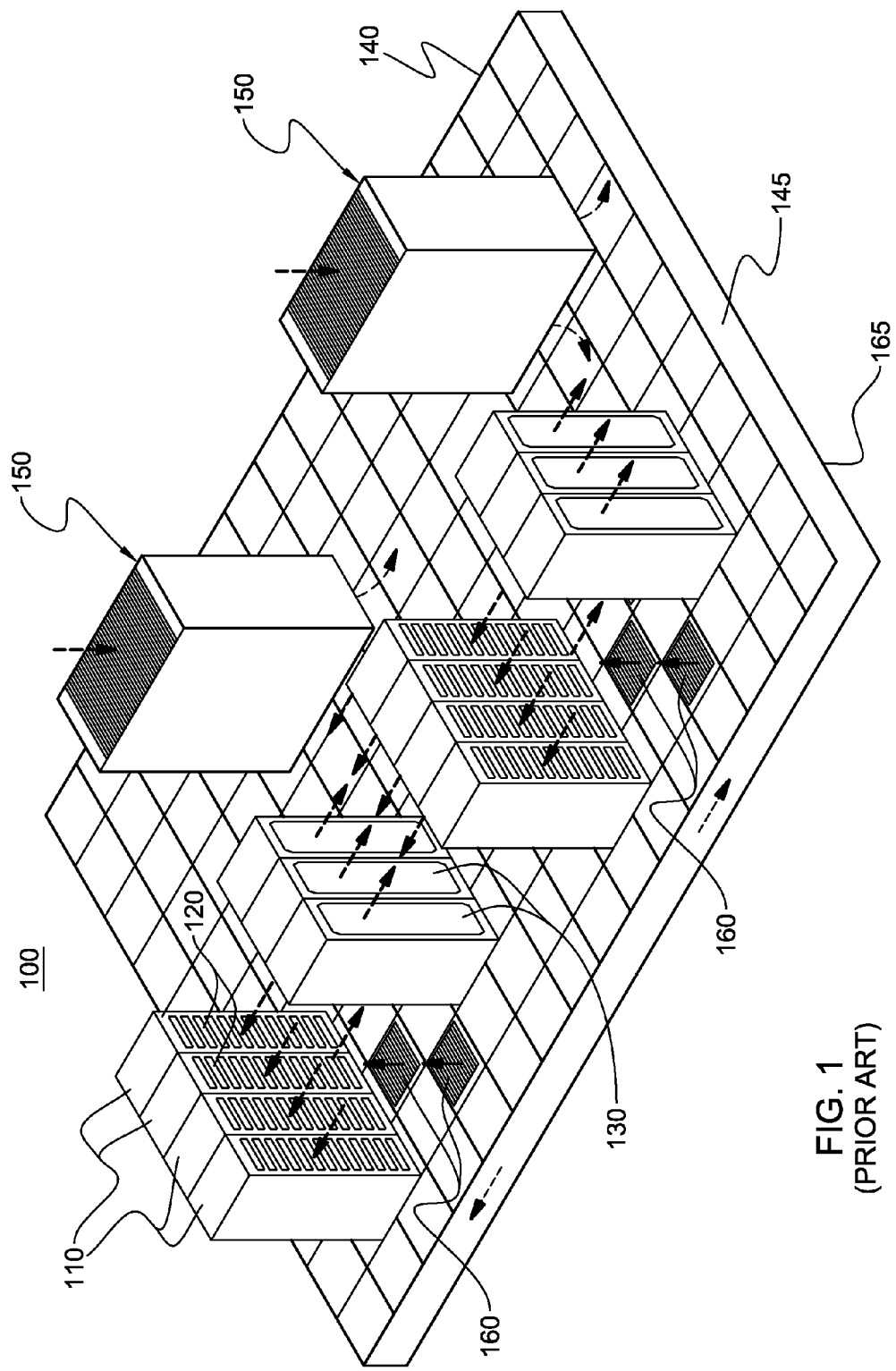
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

As noted briefly above, understanding and improving energy efficiency of a data center system, such as depicted in FIG. 1, is important from a cost and a sustainability perspective.

Figure 2:
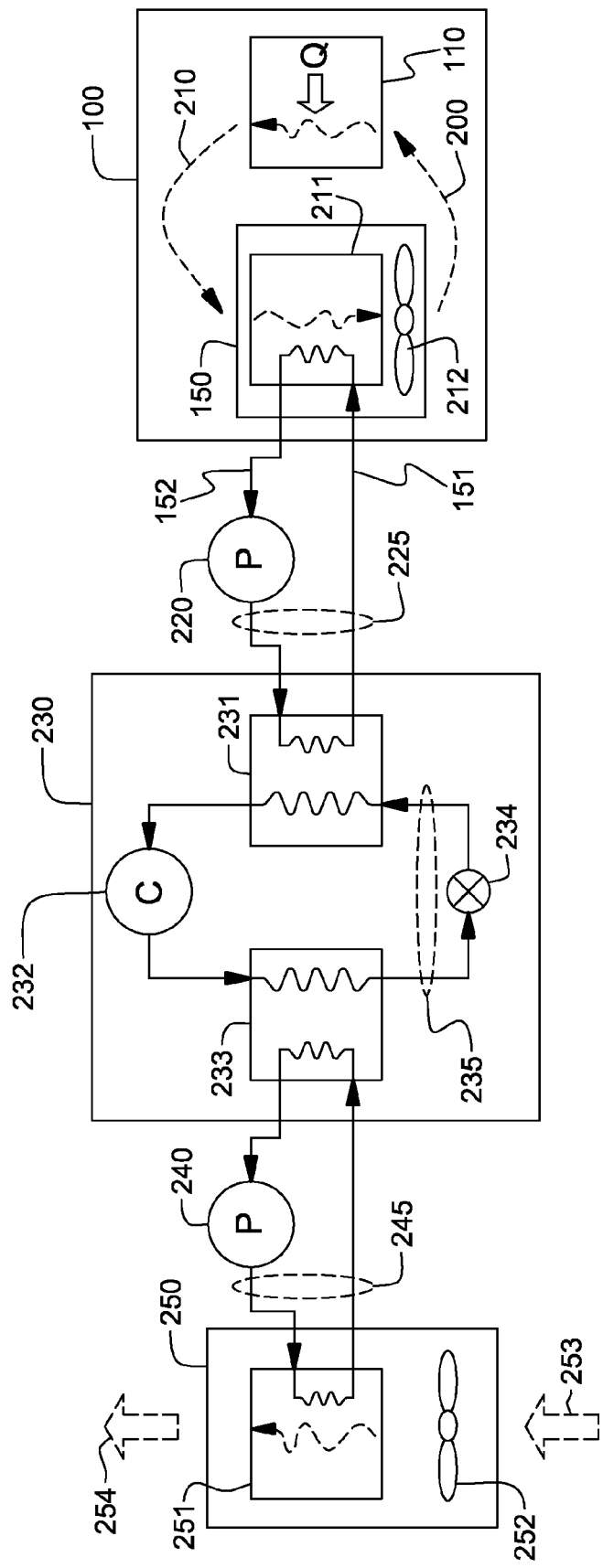
FIG. 2 is a schematic of a conventional apparatus for cooling a raised floor data center.

By way of example, FIG. 2 depicts a schematic of a conventional cooling energy flow for a data center facility, such as depicted in FIG. 1. The air-cooled data center 100 includes one or more electronics racks 110, which are to be air-cooled using one or more air-conditioning units 150, referred to in the art as computer room air-conditioning (CRAC) units. Cooled air 200 is exhausted from an air-conditioning unit 150 via one or more air-moving devices 212, and provided, for example, via an under-floor air plenum to an air inlet side of electronics rack 110. The cool air is passed through electronics rack 110 to extract heat, and the heated exhaust air 210 is eventually returned to air-conditioning unit 150. A liquid-to-air heat exchanger 211 is disposed within air-conditioning unit 150 to extract heat from exhaust air 210 and exhaust the heat to water flowing through a facility water loop 225, defined in one embodiment by a coolant inlet line 151, and a coolant outlet line 152 coupled to the liquid-to-air heat exchanger 211 of air-conditioning unit 150.

A pump, such as a building-chilled water pump 220 moves coolant through facility water loop 225 from liquid-to-air heat exchanger 211 of air-conditioning unit 150 to an evaporator heat exchanger 231 of a refrigeration chiller plant 230. A refrigeration loop 235 is provided within refrigeration chiller plant 230, and heat is extracted within evaporator heat exchanger 231 from coolant passing through facility water loop 225. The heated refrigerant within refrigerant loop 235 is passed through a chiller compressor 232, and a condenser heat exchanger 233, before being returned via an expansion valve 234 as chilled refrigerant, for again cooling coolant within facility water loop 225. Condenser 233 is shown to comprise (in this embodiment) a liquid-to-liquid heat exchanger for expelling heat from the refrigerant within refrigerant loop 235 to, for example, a cooling tower water loop 245 coupling condenser 233 of refrigeration chiller plant 230 to an evaporative cooling tower 250. Within cooling tower loop 245, hot water exits condenser 233, and is pumped via a condenser water pump 240 through a cooling tower heat exchanger 251 for cooling, with cooled water being returned to condenser 233. Evaporative cooling tower 250 further includes an air-moving device 252 for moving cool ambient air 253 across cooling tower heat exchanger 251, from which warm air 254 is expelled. In one embodiment, cooling tower heat exchanger 251 is a liquid-to-air heat exchanger.

Computer equipment is typically designed with an assumption that the rack air inlet temperature will be in the range of 20°-30° C. Airflow distribution within a data center has a major impact on the thermal environment of the data processing equipment located within the room. To provide a cool and controlled humidity environment, operators of such equipment commonly utilize two types of air distribution configurations, namely, a raised floor supply configuration, such as illustrated in FIG. 1, and an overhead supply layout. The most prominent, high performance data center air ventilation configuration is the raised floor arrangement, wherein chilled air enters the room via floor vents and exits the room into air-conditioning units.

As noted above, in such a configuration, chilled air enters the room via perforated floor tiles, passes through the electronics racks, becomes heated in the process, and then finds its way back to the intake of the air-conditioning units, which cool the hot air and exhaust it into the under-floor plenum. Sub-ambient refrigerated water leaving the chiller plant evaporator is circulated through the air-conditioning units using building-chilled water pumps. A condenser pump circulates water between the chiller condenser and the air-cooled cooling tower, as illustrated in FIG. 2.

In a standard facility cooling design, the primary energy consumption components include: the server rack fans; the air-moving devices within the air-conditioning units; the building-chilled water pumps; the refrigeration chiller-compressors; the condenser water pumps; and the air-moving devices of the cooling tower. There are several reasons why the standard design can be prohibitively inefficient with respect to energy use. For example, use of sub-ambient air to cool the electronics racks mean that refrigeration chillers are needed, which are typically energy intensive. Leakage of air from the under-floor plenum to undesired areas of the data center is often a problem, and pressure drop is an issue for the under-floor plenum implementation. Further, as illustrated in FIG. 2, several daisy-chained coolant loops are needed to extract and reject the heat.

Presented hereinbelow are apparatuses and methods for cooling one or more electronics racks of a data center which significantly improve and dynamically maximize energy efficiency over the above-discussed conventional design. For example, energy consumption is dynamically adjusted for optimal energy efficiency responsive to variation in rack power consumption and/or in ambient air temperature. As further background, reference co-pending, commonly assigned U.S. patent application Ser. No. 12/031,961, filed Feb. 15, 2008, entitled "Method and Air-Cooling Unit with Dynamic Airflow and Heat Removal Adjustability"; Ser. No. 11/862,328, filed Sep. 27, 2007, entitled "Docking Station with Closed Loop Airflow Path for Facilitating Cooling of an Electronics Rack"; and Ser. No. 11/862,346, filed Nov. 26, 2007, entitled "Docking Station with Hybrid Air and Liquid Cooling of an Electronics Rack", the entirety of each of which is hereby incorporated herein by reference.

Figure 3:
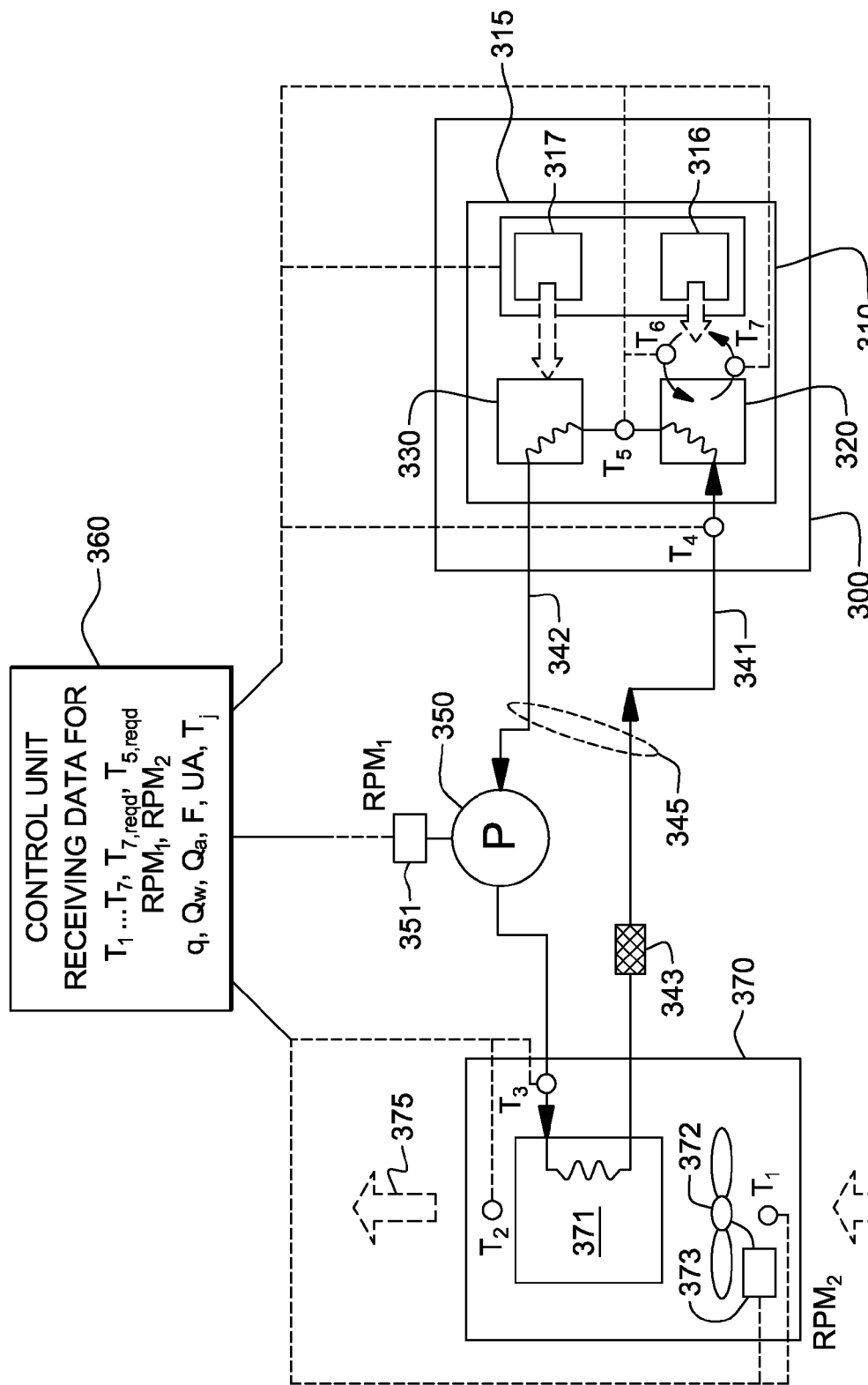
FIG. 3 is a schematic of one embodiment of an apparatus for cooling an electronics rack of (for example) a data center installation, in accordance with an aspect of the present invention.

FIG. 3 illustrates one embodiment of an apparatus, in accordance with an aspect of the present invention. The apparatus is an efficient energy cooling design comprising two enclosures, that is, an electronics rack enclosure 310, disposed within, for example, a data center room 300, and a remote (or local) heat exchange enclosure 370, which may be disposed remote from the data center room containing the electronics rack to be cooled. The two enclosures are fluidically coupled via a single liquid coolant loop 345 comprising a coolant inlet line 341 to and a coolant outlet line 342 from electronics rack enclosure 310. An adjustable pump 350 is provided for establishing coolant flow through the liquid coolant loop 345, and an optional filter 343 may be employed within the liquid coolant loop as well.

Electronics rack enclosure 310 encloses an electronics rack 315 which includes electronic components 316 to be air-cooled, and higher heat flux electronic components 317, which are attached to one or more liquid-cooled cold plates 330. By way of example, electronic components 317 might comprise one or more CPU modules. The heat dissipated by electronic components 316, 317 is rejected in part to air circulating within electronics rack enclosure 310, and in part to cold plates 330. In one implementation, electronics enclosure 310 comprises one or more walls, and a cover coupled to the at least one wall, which define a central opening sized to accommodate electronics rack 315 therein. The enclosure surrounds the electronics rack and facilitates establishing a closed loop airflow path therein passing through the electronics rack, and as described further below, through one or more air-to-liquid heat exchange assemblies 320 of the apparatus. The one or more air-to-liquid heat exchange assemblies 320 cool air circulating through the closed loop airflow path. The balance of the heat rejected within electronics rack enclosure 110 is rejected, via the one or more liquid-cooled cold plates 330, directly to liquid coolant within the liquid coolant loop 345. These cold plates are attached to higher heat flux and higher heat load components within the electronics rack. In the embodiment depicted, the one or more air-to-liquid heat exchange assemblies are coupled in-series with the one or more liquid-cooled cold plates, such that liquid passing through the heat exchange assemblies also passes through the cold plates. This configuration is provided by way of example only. In alternate embodiments, heat may be extracted within the electronics rack enclosure using only air-cooling, or using only multiple liquid-cooled cold plates.

At the other end of the liquid coolant loop 345 is the heat exchange enclosure 370, which as noted, may be remote, or even local, to the electronics rack enclosure. In one implementation, the heat exchange enclosure includes the adjustable pump 350 and a control unit 360. Further, in one embodiment, the heat exchange enclosure is similarly sized and configured to the electronics rack enclosure, which may provide a customer with certain layout benefits. Additionally, a one-to-one correspondence of heat exchange enclosure 370 to electronics rack enclosure 310 simplifies the cooling apparatus needed to cool the electronics rack. Heat extracted by the liquid coolant loop 345 is rejected as heated air 375 exhausting from heat exchange enclosure 370. Ambient air 374 is drawn into heat exchange enclosure 370 via one or more air-moving devices 372, which direct the ambient airflow across a liquid-to-air heat exchange assembly 371 for facilitating cooling of the liquid coolant passing through liquid coolant loop 345.

In accordance with an aspect of the present invention, the apparatus comprises control unit 360, which automatically dynamically adjusting energy consumption of the heat removal unit. Again, in one embodiment, the heat removal unit comprises liquid coolant pump 350 and air-moving device 372. The dynamic adjustment is such as to limit energy consumption thereof while providing (for example) only a required, specified cooling to the electronics rack employing the liquid coolant passing through a heat extraction mechanism. In one embodiment, the heat extraction mechanism includes at least one air-to-liquid heat exchange assembly 320 and at least one liquid-cooled cold plate 330 coupled in in-series fluid communication, as illustrated in FIG. 3. However, as noted above, other heat extraction mechanisms may be employed, including, air-cooling only (via one or more air-to-liquid heat exchange assemblies) or liquid-cooling only (via one or more cold plates attached to heat-generating components of the electronics rack). Control unit 360 accomplishes this employing (in one embodiment) a first variable frequency drive 351 coupled to liquid coolant pump 350 and a second variable frequency drive 373 coupled to air-moving device(s) 372. Numerous variables are employed, determined or controlled by the control unit, as explained further below with reference to FIGS. 7A & 7B. These variables include, in part, $T_1 \ldots T_7$, $T_{7,reqd}$, $T_{5,reqd}$, $RPM_1$, $RPM_2$, q, $Q_w$, $Q_a$, F, UA & $T_j$, each of which is defined below in Table 1.

TABLE 1

| Variable | Definition |
|---|---|
| q | Required cold plate module heat dissipation, W. |
| $Q_w$ | Required rack heat load to be removed via the cold plates, W. |
| $Q_a$ | Required rack heat load to be removed by the recirculating airflow, W |
| F | Airflow rate of the server rack, m³/s. |
| UA | Thermal conductance of the heat extraction air-to-liquid heat exchanger, W/K. |
| R | Thermal resistance of the cold plate, ° C./W. |
| $F_w$ | Volumetric liquid coolant flow rate, m³/s. |
| $C_a$ | Capacity rate of the rack recirculating airflow, W/K. |
| $C_w$ | Capacity rate of the liquid coolant flow, W/K. |
| $\rho_a$ | Density of air, kg/m³. |
| $\rho_w$ | Density of liquid coolant, kg/m³. |
| $C_{pa}$ | Specific heat capacity of the air, J/kg-K. |
| $C_{pw}$ | Specific heat capacity of the liquid coolant, J/kg-k. |
| $C_{max}$ | Larger of the two fluid streams' capacity rates in the rack heat exchanger, W/K. |
| $C_{min}$ | Smaller of the two fluid streams' capacity rates in the rack heat exchanger, W/K. |
| NTU | Number of transfer units for the rack heat exchanger. |
| ε | Effectiveness of the rack heat exchanger. |
| $Q_{est}$ | Calculated heat exchange capability of the rack heat exchanger, W. |
| $T_j$ | Required module chip temperature, ° C. |
| $T_{5,reqd}$ | Target liquid coolant temperature at the inlet to the cold plates, ° C. |
| $T_{7,reqd}$ | Target air temperature at the inlet to the electronics drawer, ° C. |
| $T_1$ | Measured temperature of the ambient air entering the heat rejection enclosure, ° C. |
| $T_2$ | Measured temperature of air exhausted from the heat rejection enclosure, ° C. |
| $T_3$ | Measured temperature of liquid coolant entering the heat rejection heat exchanger, ° C. |
| $T_4$ | Measured temperature of liquid coolant entering the rack heat exchanger, ° C. |
| $T_5$ | Measured temperature of liquid coolant entering the server nodes, ° C. |
| $T_6$ | Measured temperature of air entering the rack heat exchanger, ° C. |
| $T_7$ | Measured temperature of air entering the electronics drawers, ° C. |
| $T_8$ | Measured temperature of liquid coolant leaving the heat rejection enclosure, ° C. |
| $T_9$ | Measured temperature of liquid coolant leaving the booster unit, ° C. |
| $T_{3,est}$ | Calculated temperature of liquid coolant entering the heat rejection heat exchanger, ° C. |
| $T_{4,est}$ | Calculated temperature of liquid coolant entering the rack heat exchanger, ° C. |
| $T_{6,est}$ | Calculated temperature of air entering the rack heat exchanger, ° C. |
| $\Delta T_{in,est}$ | Inlet temperature difference for the rack heat exchanger, ° C. |
| $\Delta T$ | Specified minimum difference between specified rack inlet air temperature and ambient air temperature, ° C. |
| $\Delta T_{o,est}$ | Inlet temperature difference for the rejection heat exchanger, ° C. |
| $\Delta T_r$ | Calculated reduction in liquid coolant temperature required from booster unit, ° C. |
| $RPM_1$ | Pump motor speed in revolutions per minute. |
| $\Delta RPM$ | Specified increment of RPM used to change the pump motor speed. |
| $RPM_2$ | Air-moving device motor speed of heat rejection unit in revolutions per minute. |
| $RPM_3$ | Compressor motor speed of the booster chiller unit in revolutions per minute. |
| $RPM_4$ | Air-moving device motor speed of the booster chiller unit on condenser side in revolutions per minute. |

Figure 4:
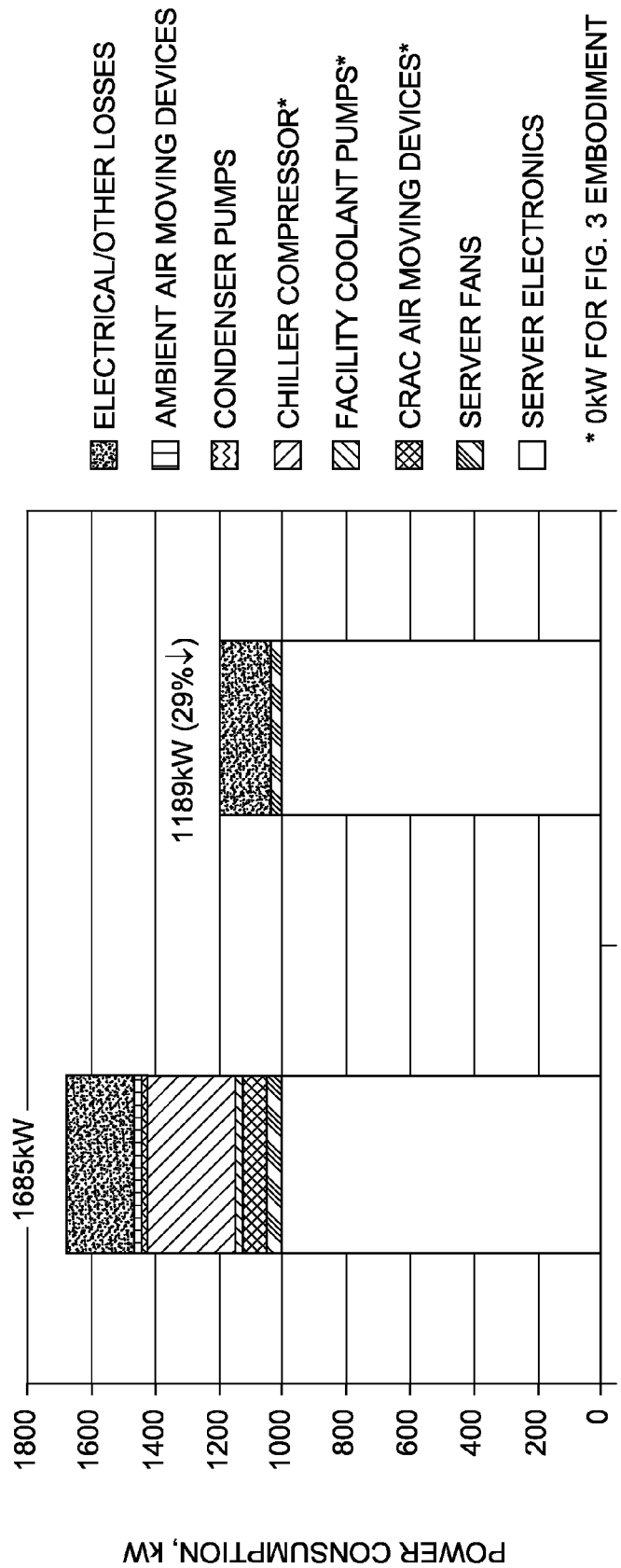
FIG. 4 graphically represents a power consumption comparison between the apparatus of FIG. 2 and the apparatus of FIG. 3, and illustrating energy savings for the apparatus of FIG. 3, in accordance with an aspect of the present invention.

FIG. 4 graphically illustrates a case study performed for a 1000 kW server heat load, which was assumed to be alternately cooled using the cooling apparatus of FIG. 2, and the cooling apparatus of FIG. 3. As illustrated in FIG. 4, the cooling apparatus of FIG. 3 employs only three of the six cooling components found in the conventional layout of FIG. 2. Specifically, the chiller compressor, facility coolant pumps and air-moving devices of the computer room air-conditioning unit(s) are omitted in the cooling apparatus implementation of FIG. 3. The total facility power consumption for this 1000 kW IT load, assuming 25° C. ambient air, was 1685 kW for the conventional cooling apparatus configuration of FIG. 2, and 1189 kW for the cooling apparatus configuration of FIG. 3, which is a 29% reduction in total annual energy use. Using current New York state prices for electricity (≈0.134 $/kWh), this translates to about a $500,000 USD savings in electricity costs.

FIGS. 5A & 5B illustrate a partial embodiment of the cooling apparatus depicted in FIG. 3. In this embodiment, the electronics rack enclosure 500 is shown to comprise an outer wall which defines a central opening sized to accommodate electronics rack 510 and at least one air-to-liquid heat exchanger 520. Electronics rack 510 is shown to comprise a plurality of electronics drawers or nodes 515, one of which is depicted in the plan view of FIG. 5A. As shown, electronics rack enclosure 500 facilitates establishing a closed loop airflow path 501 passing through electronics rack 510 and through the at least one air-to-liquid heat exchange assembly 520. Specifically, the closed loop airflow path passes through the electronics rack, turns 180°, and enters a side passage within the enclosure where it passes through the at least one air-to-liquid heat exchange assembly, and then undergoes another 180° turn and returns at an acceptable temperature to the air inlet side of the electronics rack for further cooling of electronic components therein. Airflow through the closed loop airflow path may be established, for example, using one or more air-moving devices 502 associated with electronics rack 510. This airflow cools air-cooled components 511 of electronics rack 510.

Additionally, multiple liquid-cooled cold plates 530 are illustrated, each of which is coupled to a high heat flux component (not shown) of electronics rack 510 requiring enhanced cooling. In this embodiment, as well as with the embodiment of FIG. 3, the at least one air-to-liquid heat exchange assembly 520 is coupled in series fluid communication with the multiple liquid-cooled cold plates 530. For example, in the embodiment illustrated, liquid coolant enters via a liquid coolant inlet line 521 to a liquid coolant inlet manifold 522 of air-to-liquid heat exchange assembly 520. The liquid coolant flows through the heat exchanger tubes of the heat exchange assembly to a liquid coolant outlet manifold 523, and then via an appropriate tubing connection 524 to an inlet plenum 531 of the liquid-cooled cold plates 530. At this point, liquid coolant from the inlet plenum 531 branches to the respective electronics drawers 515 via a plurality of parallel paths 532 for passing through respective liquid-cooled cold plates 530 to facilitate cooling of various heat-generating components via the cold plate structures. From the second cold plate on the left (shown in FIG. 5A), liquid coolant flows to an outlet plenum 533, from which it leaves the electronics rack enclosure via a liquid coolant outlet line 534.

In accordance with the energy efficiency concepts described herein, when the electronics rack is operative, air temperature within the electronics rack enclosure will be higher than ambient air temperature about the electronics rack enclosure. In part, this is due to the cooling apparatus described herein being configured to dynamically adjust cooling to limit energy consumption of the cooling apparatus, while providing only a required specified cooling to the electronics rack. In view of this, FIGS. 6A & 6B depict two alternate embodiments of an electronics rack enclosure, in accordance with an aspect of the present invention.

Figure 6B:
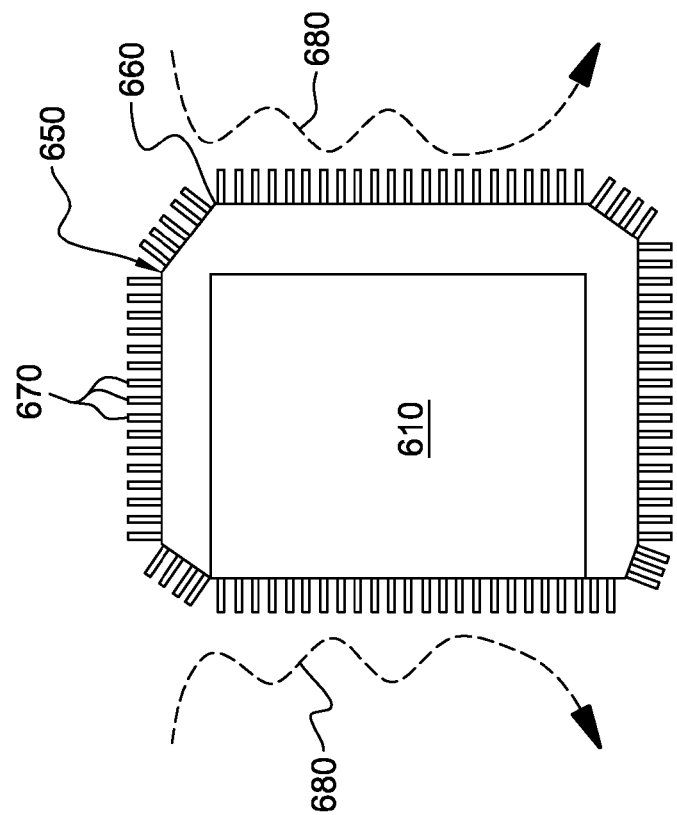
FIG. 6B is a plan view of still another partial embodiment of an apparatus for cooling an electronics rack, in accordance with an aspect of the present invention.
Figure 6A:
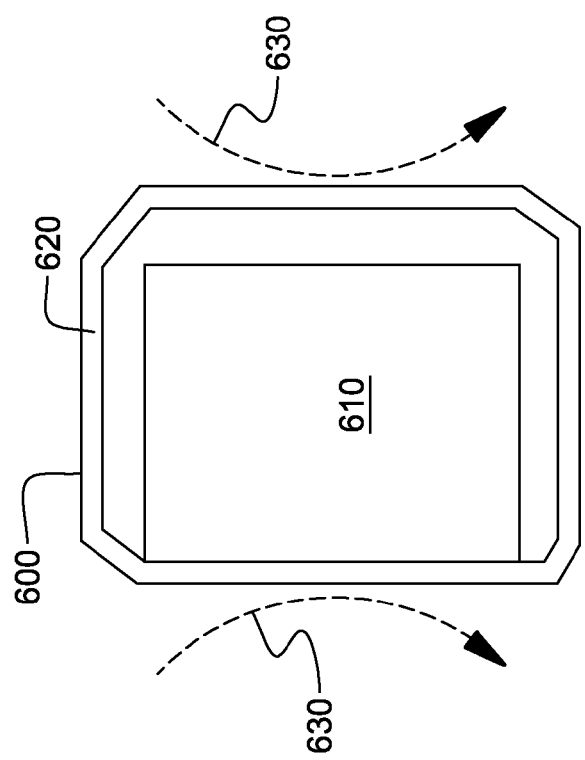
FIG. 6A is a plan view of another partial embodiment of an apparatus for cooling an electronics rack, in accordance with an aspect of the present invention.

In FIG. 6A, the electronics rack enclosure 600 is shown to contain electronics rack 610 and comprises a thermal insulation layer 620 about the outer wall of the enclosure to prevent the electronics rack and enclosure from heating cooler ambient air 630 around the enclosure. This thermal insulation layer 620, which may be (for example) a rubber or polymeric material, may also function to mitigate acoustic noise within the room containing the electronics rack enclosure. This insulating enclosure embodiment may be beneficial where there is no surplus air-conditioning capability in the room containing the electronics rack.

FIG. 6B illustrates an alternate embodiment of an electronics rack enclosure 650, which includes an outer wall 660 sized to accommodate electronics rack 610 in a central region thereof. In this embodiment, a plurality of fins, for example, plate fins or pin fins 670, extend from the outer wall 600 of electronics rack enclosure 650 to function as extended thermally conductive surfaces which enhance natural convection heat transfer of thermal energy from within electronics rack enclosure 650 to cooler ambient air 680 surrounding the enclosure. Note that although natural convection is noted, there could also be an existing draft, or even forced airflow across the outer surface of the electronics rack enclosure to facilitate transfer of heat. The electronics rack enclosure embodiment of FIG. 6B might be employed in rooms where there is a surplus of environmental air-conditioning capability, or where the environment is relatively cool, and heating is permitted.

Figure 7A:
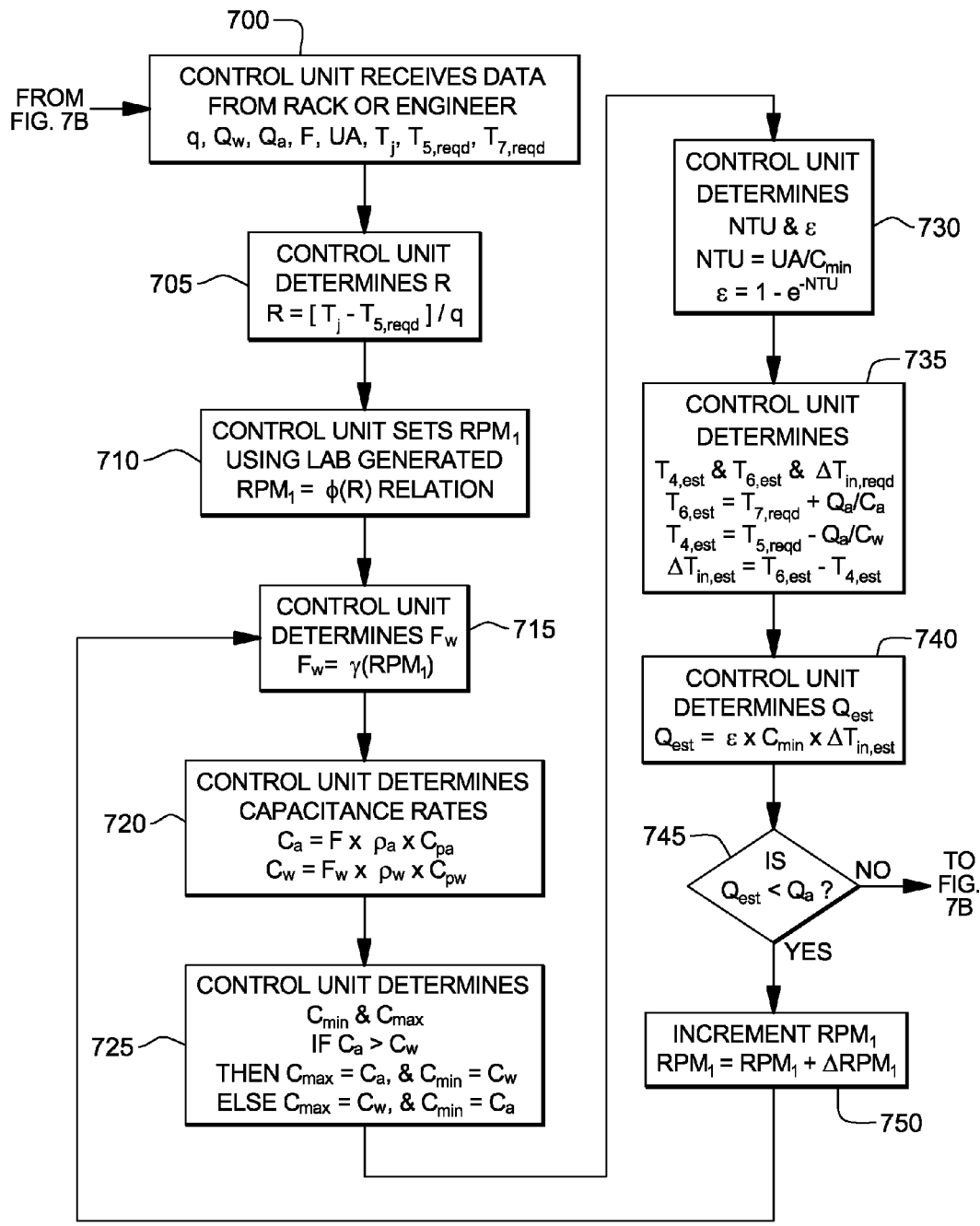
FIGS. 7A & 7B are a flowchart of one embodiment of processing implemented by a control unit of an apparatus for cooling an electronics rack, in accordance with an aspect of the present invention.
Figure 7B:
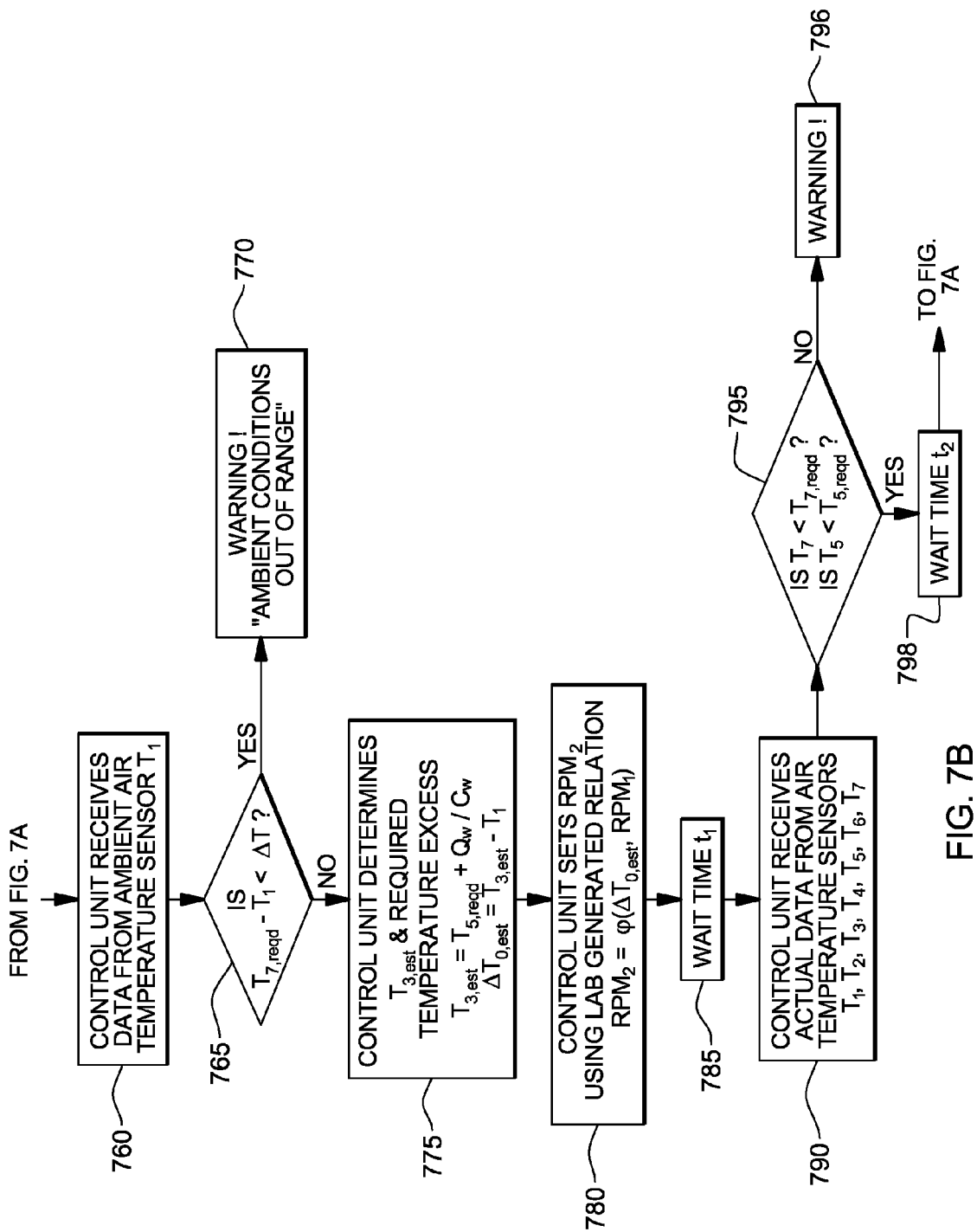

FIGS. 7A & 7B depict a flowchart of one embodiment of processing implemented by a control unit, in accordance with an aspect of the present invention. Referring first to FIG. 7A, the control unit initially receives data and/or various parameters from the electronics rack to be cooled, or from a site engineer 700. These parameters are employed by the control unit in automatically and dynamically adjusting energy usage of the heat removal components of the cooling apparatus to ensure, for example, a lowest liquid coolant pump power for a given, or required electronics rack specification (i.e., power and coolant flow rate), and a known specification for air-cooling and liquid-cooling the electronics drawers of the electronics rack. In the example illustrated, these parameters include the required cold plate module heat dissipation (q), the required rack heat load to be removed via the cold plates ($Q_w$), the required rack heat load to be removed by the recirculating airflow ($Q_a$), the airflow rate of the server rack (F), the thermal conductance of the heat extraction air-to-liquid heat exchanger (UA), the required module chip temperature ($T_j$), the target liquid temperature at the inlet to the cold plate ($T_{5,reqd}$), and the target air temperature at the inlet to the electronics rack ($T_{7,reqd}$). This information can be received directly from stored data at the electronics rack, or dynamically generated data from the electronics rack, or could be manually input by a site engineer.

The control unit first determines a required module thermal resistance (R) using the parameters $T_j$, $T_{5,reqd}$, and q 705. Then, using a lab-generated function, the initial speed or RPMs ($RPM_1$) of the liquid coolant pump of the cooling apparatus is determined 710. By way of example, a lab test might include using the cooling apparatus in a lab arrangement and collecting temperature data for various cold plate liquid flow rates. Each liquid flow rate through the cold plate corresponds to a specific liquid coolant pump speed ($RPM_1$), and corresponds to a thermal resistance value (R). Thus, a function can be derived to allow the calculation of the pump speed ($RPM_1$) if the thermal resistance is known.

In a next step, the volumetric liquid coolant flow rate ($F_w$) is calculated as a function of the liquid coolant pump speed ($RPM_1$) 715. This volumetric liquid coolant flow rate and the previously known/input server airflow rate (F), are then employed by the control unit in determining a liquid capacitance rate ($C_w$) and an air capacitance rate ($C_a$), which represent the ability of the air and liquid coolant streams to transport heat from one location to another 720. The control unit then determines which of the two capacitance rates is larger, and assigns the larger value to $C_{max}$, and assigns the other value to $C_{min}$ 725. Next, two heat exchanger parameters are determined, namely, the number of transfer units (NTU) and the effectiveness of the rack heat exchanger ($\epsilon$) 730. The NTU represents the physical size of the air-to-liquid heat exchanger, the amount of heat transfer area, and the efficiency of that area. The effectiveness ($\epsilon$) is a heat exchanger design parameter that represents how well the device is capable of transferring heat from one fluid stream to another fluid stream. Following this, the control unit proceeds to estimate or determine three required temperature quantities. These estimated temperature quantities are estimated temperature of the liquid coolant entering the electronics rack air-to-liquid heat exchange assembly ($T_{4,est}$), the estimated temperature of air entering the air-to-liquid heat exchange assembly ($T_{6,est}$), and the inlet temperature difference for the air-to-liquid heat exchanger ($\Delta T_{in,est}$) 735. The inlet temperature difference for a heat exchanger is the driving thermal potential difference for heat exchange between the two fluid streams.

The control unit next employs the determined values for effectiveness, inlet temperature difference, and $C_{min}$ to ascertain a value for the heat exchanger heat transfer rate ($Q_{est}$) 740. The object of calculating $Q_{est}$ is to check if the previous determinations to ascertain $RPM_1$ have resulted in a liquid coolant flow rate through the heat exchanger that yields the desired performance. This check is employed because in the earlier steps, $RPM_1$ was determined by considering the cold plate cooling requirements (R) only, which could result in a liquid flow rate that works for cold plate cooling, but which is an insufficient flow rate for the air-to-liquid heat exchange assembly. Thus, in a next step, $Q_{est}$ is compared with the initially specified $Q_a$ value 745, and if it is less than $Q_a$, then the liquid coolant pump speed is incremented by a specified amount ($\Delta RPM_1$) 750. This process loop is repeated until a coolant pump speed is arrived at such that both the cold plate cooling and the air-to-liquid heat exchanger cooling meet the target requirements. Once $Q_{est}$ is larger than $Q_a$, then the control unit (continuing with FIG. 7B), receives data from ambient air temperature sensor $T_1$ 760. In general, the processing of FIG. 7B is implemented by the control unit to automatically and dynamically adjust the air-moving device's airflow rate through the heat removal enclosure to ensure the lowest heat rejection pumping power for a given electronics rack condition (power and airflow rate), a known specification for air and liquid coolant entering the electronics subsystems of the electronics rack, and a known environmental ambient air temperature.

The control unit uses the ambient air temperature $T_1$ to determine the difference between the target electronics rack air inlet temperature ($T_{7,reqd}$) and the ambient temperature ($T_1$), and compare the difference to a specified minimum difference acceptable between the specified rack inlet air temperature and the ambient air temperature ($\Delta T$) 765. This offset represents how much higher the required rack inlet air temperature has to be compared to the ambient air in order for the heat rejection heat exchanger within the heat removal unit to work under reasonable conditions. While it is not possible to operate the system described in FIG. 3 such that $T_{7,reqd}$ is lower than $T_1$, it is also not reasonable for $T_{7,reqd}$ to be only, for example, 1° C. or 2° C. larger than $T_1$. In a typical implementation, $T_{7,reqd}$ would be at least 5° C.-10° C. larger than $T_1$ in order to result in reasonable air-moving device flow rates through the heat removal unit. If the value of $T_{7,reqd}$ is larger than $T_1$ by less than $\Delta T$, then a warning is triggered, alerting the data center engineer that the air ambient temperature is too high to maintain $T_{7,reqd}$ 770. Under such condition, $T_{7,reqd}$ could be relaxed to be a higher value, or the system could be shut down, or a booster refrigeration or heat exchanger option could be employed, as explained below in connection with FIGS. 8 & 9.

Assuming that the $T_{7,reqd}-T_1$ quantity is lower than $\Delta T$, then the control unit determines the estimated liquid temperature entering the heat rejection heat exchanger ($T_{3,est}$), and uses this value to determine the heat exchanger inlet temperature difference for the heat rejection heat exchanger ($\Delta T_{o,est}$), which is the driving thermal potential for heat exchange between the hot liquid coolant and the ambient air being blown through the heat removal unit 775. As with the system parameters noted above, lab testing can be employed to determine a relationship between the air-moving device motor speed ($RPM_2$) and the heat exchanger inlet temperature difference for the heat rejection heat exchanger ($\Delta T_{o,est}$). Thus, knowledge of the estimated value for $\Delta T_{o,est}$ can be used to calculate a value for the air-moving device motor speed ($RPM_2$). The control unit then sets the air-moving device motor speed ($RPM_2$) 780, and waits a time interval ($t_1$) 785, before proceeding to obtain temperature information from the various temperature sensors $T_1 \ldots T_7$ noted in Table 1 and illustrated in FIG. 3 790. The actual values for rack air and liquid coolant inlet temperatures, namely $T_7$ and $T_5$, respectively, are next compared with the required target values, namely, $T_{7,reqd}$ and $T_{5,reqd}$ 795. If the actual values are lower than the required, specified values, then the control unit waits a time interval $t_2$ 798, before returning to the process flow of FIG. 7A to repeat the processing described above. If, however, one or both actual values are higher than the specified values, then the control unit flags a warning for the data center engineer 796.

Figure 8:
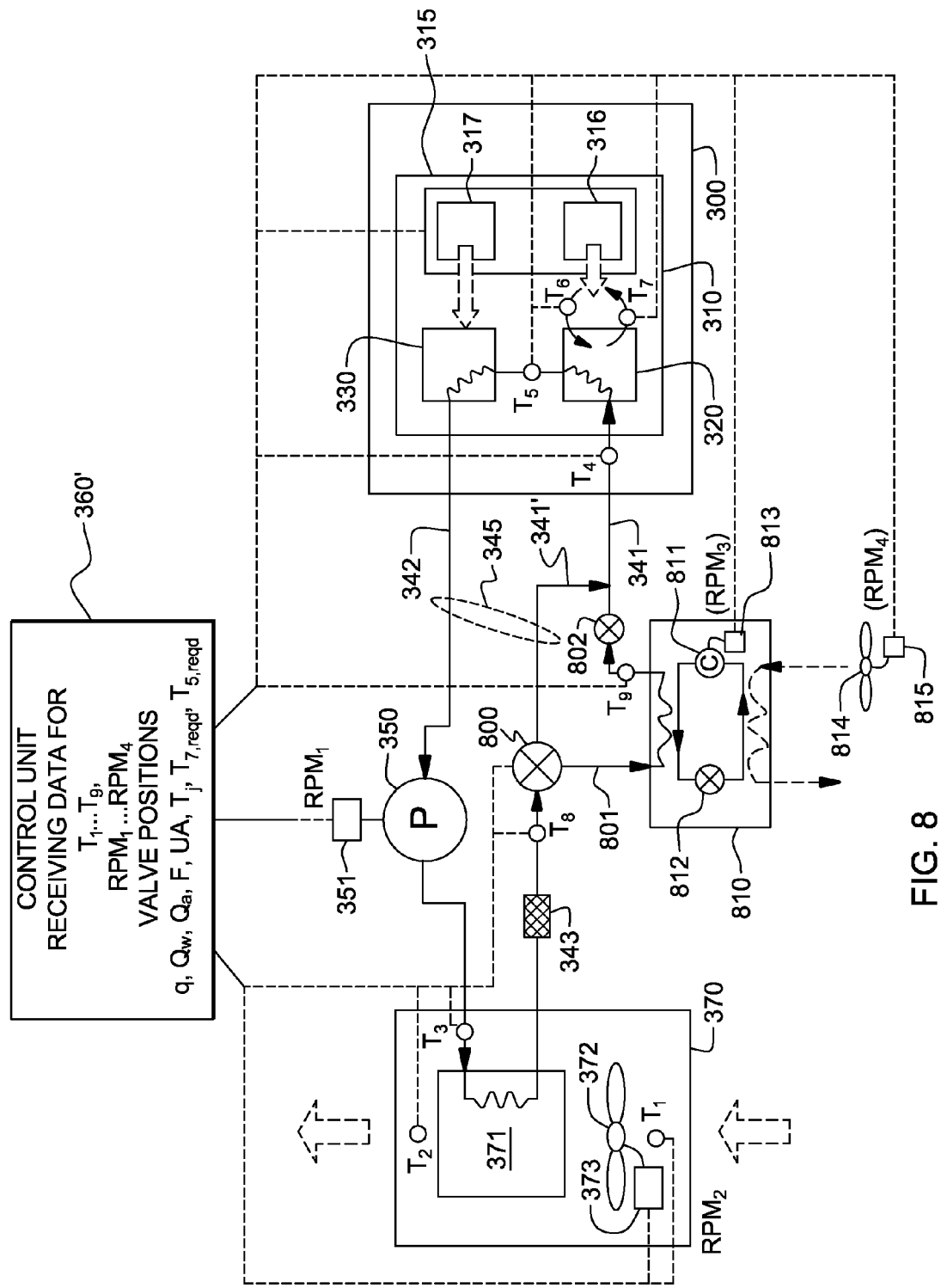
FIG. 8 is a schematic of an alternate embodiment of an apparatus for cooling an electronics rack, in accordance with an aspect of the present invention.

FIG. 8 depicts an alternate embodiment of an apparatus for cooling an electronics rack, in accordance with an aspect of the present invention. This alternate embodiment repeats many of the apparatus components described above in connection with the embodiment of FIG. 3. Only the additional structures are described below.

In accordance with the embodiment of FIG. 8, a booster chiller unit 810 is disposed after heat exchange enclosure 370 for selective, partial or full supplemental cooling of liquid coolant within liquid coolant loop 345. As explained further below, control unit 360' is provided with functionality to selectively pass a portion or all of the liquid coolant flowing through liquid coolant loop 345 through booster chiller unit 810 for enhanced cooling thereof. This enhanced cooling can be employed in situations where it is anticipated that the ambient temperature will be higher than the desired or specified rack inlet coolant (air or liquid) temperatures. Operationally, the hot liquid coolant leaving the electronics rack enclosure 310 is first cooled via the liquid-to-air heat exchanger 371 within heat exchange enclosure 370, and then subsequently, supplementally cooled via refrigeration employing vapor-compression chiller unit coils within booster chiller unit 810.

A three-way valve 800, controlled by control unit 360', allows for a specified amount of liquid coolant to be routed via coolant line 801 through the booster chiller unit 810. As illustrated, the booster chiller unit includes a compressor 811, with a variable frequency drive 813 controlled by control unit 360', as well as an air-moving device 814, with a variable frequency drive 815 controlled by control unit 360'. The variable frequency drives 813, 815 allow control unit 360' to set and dynamically adjust motor speeds $RPM_3$ and $RPM_4$ for the compressor 811 and air-moving device 814. An expansion valve 812 is also provided within the booster chiller unit to facilitate cooling of the liquid coolant being diverted through the booster chiller unit. A one-way valve 802 is disposed to prevent liquid coolant flow in the opposite direction through the booster chiller unit. Thus, liquid coolant may pass entirely through line 341' of liquid loop 345, or be diverted via adjustable three-way control valve 800 through liquid coolant line 801 to the booster chiller unit. The valve positions and the respective motor speeds for the supplemental cooling are dynamically adjusted by the control unit, as described further below. Two temperature sensors, $T_8$ and $T_9$ can be employed to sense the liquid coolant temperature at the outlet of heat exchange enclosure 370 and at the outlet of booster chiller unit 810.

Figure 9:
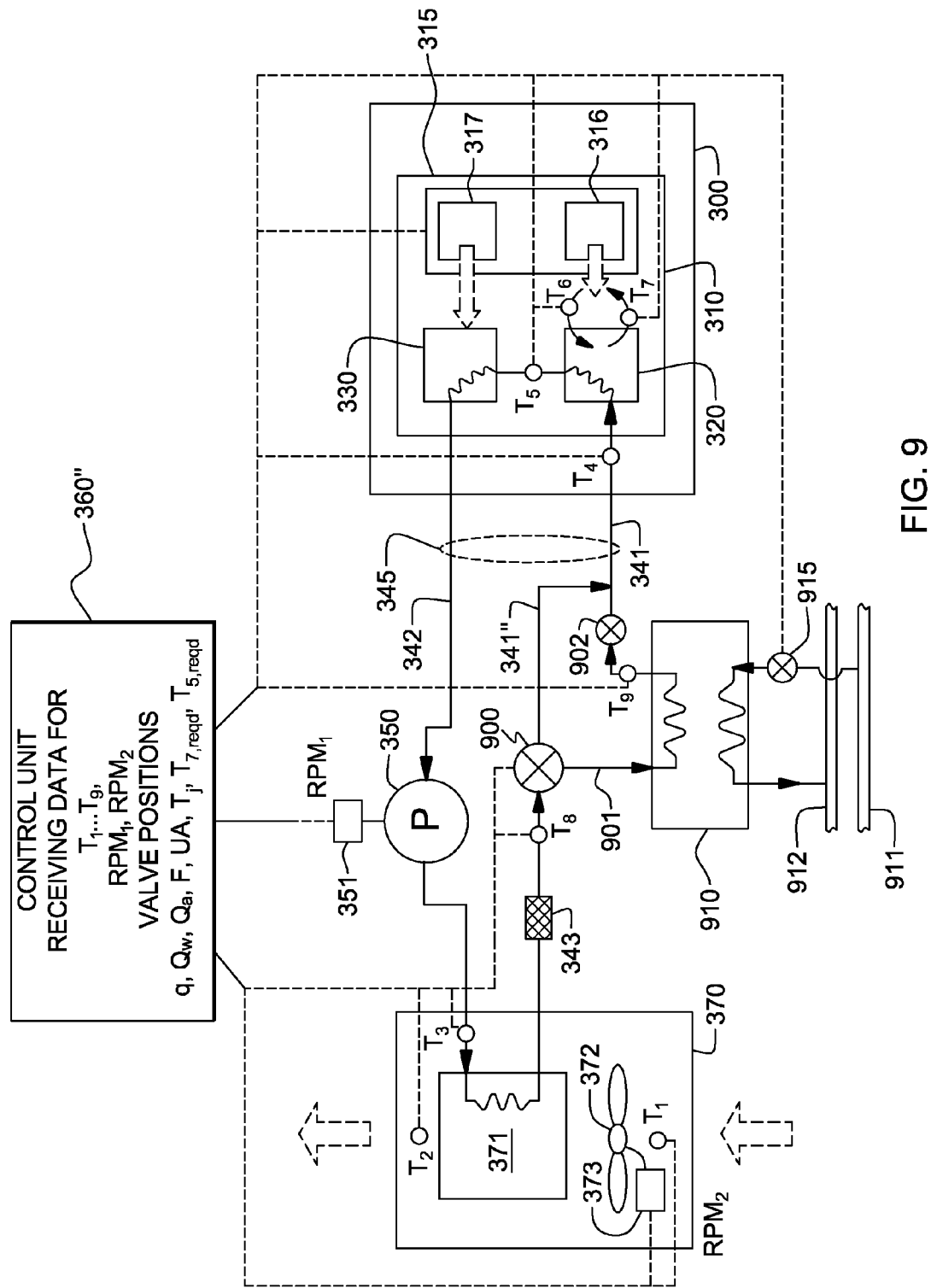
FIG. 9 is a schematic of another alternate embodiment of an apparatus for cooling an electronics rack, in accordance with an aspect of the present invention.

FIG. 9 depicts another alternate embodiment of an apparatus for cooling an electronics rack, in accordance with an aspect of the present invention. This alternate embodiment also provides supplemental cooling to the liquid coolant flowing within the liquid coolant loop 345 of the apparatus of FIG. 3. Only the additional structures are described below.

The apparatus of FIG. 9 includes a booster unit 910, which provides the supplemental cooling. However, rather than a refrigeration-based supplemental cooling approach such as depicted in FIG. 8, the booster unit in the embodiment of FIG. 9 employs a liquid-to-liquid heat exchanger and facility coolant provided via a facility coolant supply line 911 and a facility coolant return line 912. This supplemental cooling implementation is again advantageous in cases where it is anticipated that the ambient temperature ($T_1$) may be higher than the desired or specified server inlet coolant (air or liquid) temperatures.

In operation, hot liquid coolant exiting electronics rack enclosure 310 is first cooled via ambient air flowing across the liquid-to-air heat exchanger 371 of heat exchange enclosure 370, and then subsequently supplementally cooled (as needed) via booster unit 910. As needed cooling is controlled by control unit 360" via operation of a three-way control valve 900 within liquid coolant loop 345, and a control valve 915 disposed between facility coolant supply line 911 and the liquid-to-liquid heat exchanger within booster unit 910. Using these control valves 900, 915, control unit 360" respectively controls the amount of liquid coolant directed via coolant line 901 through booster unit 910, as well as the amount of chilled facility coolant directed through booster unit 910 from facility coolant supply line 911 (and thus the amount of cooling applied). A one-way valve 902 is provided to prevent liquid coolant flow in the opposite direction through booster unit 910. Liquid coolant flowing within liquid coolant loop 345, upon exiting liquid-to-air heat exchanger 371 either passes through coolant line 901, or coolant line 341" before entering via coolant line 341 into the electronics rack enclosure 310. When ambient air temperature is substantially below the desired or specified server inlet coolant (air or liquid) temperatures, then supplemental cooling is unnecessary. However, as ambient air temperature approaches or exceeds the desired or specified server inlet coolant (air or liquid) temperatures, then dynamically increasing supplemental cooling of the liquid coolant within the liquid coolant loop can be provided by control unit 360" via valves 900, 915.

Figure 10:
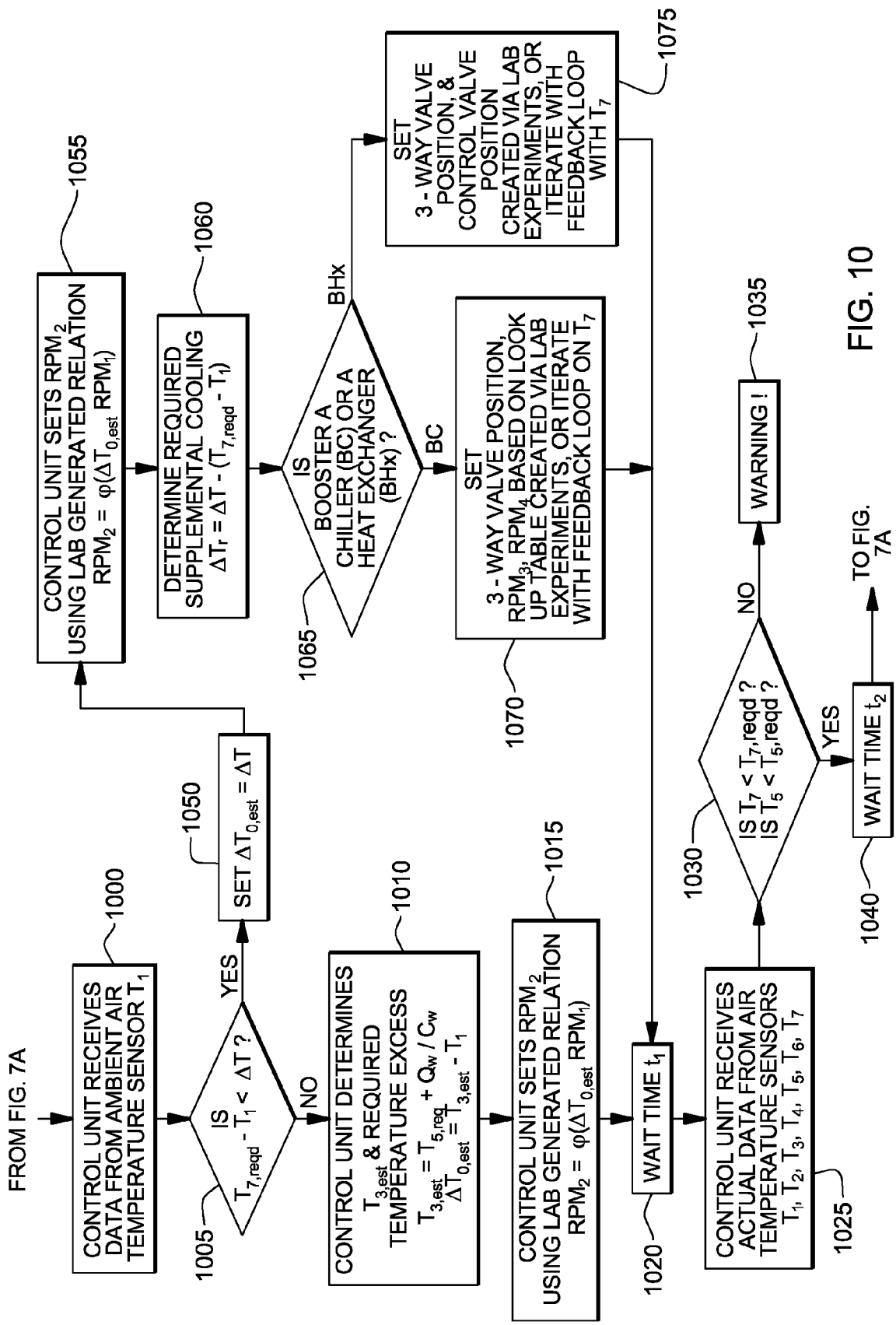
FIG. 10 is a flowchart of an alternate processing embodiment to the processing depicted in FIG. 7B, and employing the apparatus embodiment of FIG. 8 or of FIG. 9, in accordance with an aspect of the present invention.

FIG. 10 depicts one embodiment of processing implemented via control unit 360' of FIG. 8 or control unit 360" of FIG. 9, which allows for selective supplemental cooling of the liquid coolant flowing through the liquid coolant loop of the apparatus. This processing logic substitutes for the logic of FIG. 7B, described above. Continuing from the processing of FIG. 7A, the control unit receives data from ambient air temperature sensor $T_1$ 1000, and determines whether the difference between the target electronics rack air inlet temperature ($T_{7,reqd}$) and the ambient air temperature ($T_1$) is less than a specified offset value ($\Delta T$) 1005. The offset value again represents how much higher the required rack inlet air temperature has to be compared to the ambient air in order for the heat rejection heat exchanger within the heat removal unit to work under typical conditions. Assuming that the difference is less than the specified offset value, then following the "no" branch, control unit processing determines the estimated liquid temperature entering the heat rejection heat exchanger ($T_{3,est}$), and uses this value to determine the heat exchanger inlet temperature difference for the heat rejection heat exchanger ($\Delta T_{o,est}$), which is the driving thermal potential for heat exchange between the hot liquid coolant and the ambient air being blown through the heat removal unit 1010.

As with the processing described above, lab testing can be employed to determine a relationship between the air-moving device motor speed ($RPM_2$) and the heat exchanger inlet temperature difference for the heat rejection heat exchanger ($\Delta T_{o,est}$). Thus, knowledge of the estimated value for $T_{o,est}$ can be used to calculate a value for the air-moving device motor speed ($RPM_2$) 1015. The control unit then sets the air-moving device motor speed ($RPM_2$), and waits a time interval ($t_1$) 1020, before proceeding to obtain temperature information from the various temperature sensors $T_1 \ldots T_7$ noted in Table 1 and illustrated in FIGS. 8 & 9 1025. The actual values for rack, air and liquid coolant inlet temperatures, namely $T_7$ & $T_5$, respectively, are then compared with the required target values, namely, $T_{7,reqd}$ & $T_{5,reqd}$ 1030. If the actual values are lower than the specified values, then the control unit waits a time interval $t_2$ 1040, before returning to the process flow of FIG. 7A to repeat the processing described above. If, however, one or both actual values are higher than the specified values, then the control unit flags a warning for the data center engineer 1035.

Returning to inquiry 1005, if the difference between $T_{7,reqd}$ and $T_1$ is less than the specified offset value ($\Delta T$), then the inlet temperature difference value for the heat rejection heat exchanger ($\Delta T_{o,est}$) is assigned a value equal to the specified offset value ($\Delta T$) 1050. Using this value of $\Delta T_{o,est}$, the control unit sets $RPM_2$ in a similar manner to that described above in connection with FIG. 7B. This ensures that the air-moving device within the heat removal unit will operate at the highest possible reasonable airflow rate, thus removing the largest amount of heat load that can be efficiently removed from the liquid coolant loop.

Following this, the control unit determines the amount of supplemental cooling that is required ($\Delta T_r$) from the booster unit 1060. This is calculated by subtracting $T_1$ and $T_{7,reqd}$ from $\Delta T$. Next, the control unit determines whether a booster chiller (BC) unit or a booster heat exchange (BHx) is being used, in accordance with the apparatus embodiments of FIGS. 8 & 9, respectively 1065. If a BC unit is employed, then the control unit manipulates the three-way valve (described above), the compressor motor speed ($RPM_3$), and the condenser fan speed ($RPM_4$) using values from, for example, a lookup table 1070. Alternatively, these values could be manipulated via a feedback loop that checks to see if the requisite supplemental cooling is being achieved. If a BHx unit is employed, then the facility coolant control unit manipulates the corresponding three-way valve, and the facility coolant control valve, using valve data from a lookup table 1075. Alternatively, these parameters could be manipulated via a feedback loop that checks to see if the requisite supplemental cooling is being achieved. Once this has been accomplished, the control unit returns to the main processing loop and waits time $t_1$, before proceeding to collect the temperature sensor data for processing, as described above.

The detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for cooling of an electronics rack, the apparatus comprising:

at least one heat extraction mechanism for facilitating cooling of the electronics rack, the at least one heat extraction mechanism comprising at least one liquid-cooled cold plate coupled to at least one heat-generating component within the electronics rack;

an enclosure comprising at least one wall, a cover coupled to the at least one wall, and a central opening sized to accommodate the electronics rack and the at least one heat extraction mechanism therein, wherein when operatively employed, the enclosure surrounds the electronics rack;

a heat removal unit disposed external to the enclosure and in fluid communication with the at least one heat extraction mechanism within the enclosure for removing heat from liquid coolant passing therethrough, the at least one heat extraction mechanism and the heat removal unit being coupled via a liquid coolant loop, wherein the heat removal unit comprises a liquid-to-air heat exchanger, a coolant pump and an air-moving device, the liquid-to-air heat exchanger removing heat from the liquid coolant within the liquid coolant loop before passing through the at least one heat extraction mechanism, the coolant pump pumping the liquid coolant through the liquid coolant loop, and the air-moving device moving air across the liquid-to-air heat exchanger; and a control unit coupled to the heat removal unit to automatically control and minimize energy consumption of the heat removal unit while achieving a specified level of cooling of the electronics rack employing the liquid coolant passing through the at least one heat extraction mechanism within the enclosure, wherein the control unit is coupled to the coolant pump via a first variable frequency drive and is coupled to the air-moving device via a second variable frequency drive, and wherein the control unit dynamically adjusts energy consumption of the heat removal unit by:

determining thermal resistance (R) of the at least one liquid-cooled cold plate;

initially setting RPMs of the coolant pump via the first variable frequency drive using a first pre-generated relation relating thermal resistance (R) of the at least one liquid-cooled cold plate to coolant pump RPMs; and subsequently setting RPMs of the air-moving device via the second variable frequency drive using a second pre-generated relation relating a target liquid coolant inlet temperature of the at least one liquid-cooled cold plate and the coolant pump RPMs to air-moving device RPMs.

2. The apparatus of claim 1, wherein the at least one heat extraction mechanism comprises at least one air-to-liquid heat exchange assembly for facilitating air-cooling of the electronics rack, and wherein the enclosure facilitates establishing a closed loop airflow path therein passing through the electronics rack and through the at least one air-to-liquid heat exchange assembly, the at least one air-to-liquid heat exchange assembly cooling air circulating through the closed loop airflow path.

3. The apparatus of claim 2, wherein the at least one liquid-cooled cold plate and the at least one air-to-liquid heat exchange assembly of the at least one heat extraction mechanism are serially coupled in fluid communication with the liquid coolant passing through the at least one air-to-liquid heat exchange assembly also passing through the at least one liquid-cooled cold plate.

4. The apparatus of claim 1, wherein the control unit is coupled to the heat removal unit for dynamically adjusting energy consumption of the heat removal unit to minimize energy consumption thereof while providing a required specified cooling to the electronics rack employing at least one of a target air inlet temperature to the electronics rack for air-cooling thereof, and the target liquid coolant inlet temperature to at least one liquid-cooled cold plate for cooling at least one heat-generating component of the electronics rack.

5. The apparatus of claim 1, wherein the control unit receives as input for automatically controlling and minimizing energy consumption of the heat removal unit a required liquid-cooled cold plate heat dissipation (q), a required rack heat load to be removed via the liquid-cooled cold plate ($Q_w$), a required rack heat load to be removed via a recirculating air flow within the enclosure ($Q_a$), an airflow rate through the electronics rack (F), a thermal conductance of an air-to-liquid heat exchanger of the at least one heat extraction mechanism (UA), a required heat-generating component temperature ($T_j$), the target liquid coolant inlet temperature of the at least one liquid-cooled cold plate ($T_{5\ reqd}$) and a target air inlet temperature of the electronics rack containing the at least one heat-generating component ($T_{7\ reqd}$).

6. The apparatus of claim 5, wherein the control unit, after initially setting RPMs of the coolant pump, and before setting RPMs of the air-moving device, determines whether an adjustment to the coolant pump RPMs is required by comparing a calculated heat exchange capability of an air-to-liquid heat exchange assembly of the at least one heat extraction mechanism ($Q_{est}$) with the required rack heat load to be removed via the recirculating airflow within the enclosure ($Q_a$).

7. The apparatus of claim 6, wherein the at least one heat extraction mechanism comprises the air-to-liquid heat exchange assembly for facilitating air-cooling of the electronics rack, and wherein the enclosure facilitates establishing a closed loop airflow path therein passing through the electronics rack and through the at least one air-to-liquid heat exchange assembly, the at least one air-to-liquid heat exchange assembly cooling air circulating through the closed loop airflow path, wherein the at least one liquid-cooled cold plate and the at least one air-to-liquid heat exchange assembly are serially coupled in fluid communication with coolant passing through the at least one air-to-liquid heat exchange assembly also passing through the at least one liquid-cooled cold plate, and wherein the apparatus further comprises a first temperature sensor for sensing an inlet air temperature to the electronics rack within the enclosure, a second temperature sensor for sensing a liquid coolant inlet temperature to the at least one liquid-cooled cold plate, and a third temperature sensor for sensing an ambient temperature of air moving across the at least one liquid-to-air heat exchanger via the air-moving device, wherein the first temperature sensor, second temperature sensor and third temperature sensor are coupled to the control unit for facilitating dynamic adjustment of energy consumption of the heat removal unit by the control unit to minimize energy consumption thereof while providing the required cooling to the electronics rack.

8. The apparatus of claim 7, wherein the control unit dynamically determines, based on sensed ambient temperature of air moving across the at least one liquid-to-air heat exchanger, and the target air inlet temperature to the electronics rack, whether supplemental cooling of the liquid coolant is required, and if so, the control unit automatically dynamically passes at least a portion of the liquid coolant passing through the liquid coolant loop through a supplemental heat removal unit, the supplemental heat removal unit comprising one of a supplemental refrigeration chiller or a supplemental heat exchanger coupled to the liquid coolant loop between the heat removal unit and the enclosure.

9. The apparatus of claim 1, wherein when the electronics rack is operative within the enclosure, temperature within the enclosure is greater than ambient temperature about the enclosure, and wherein the enclosure comprises one of a thermally insulation layer to prevent exhausting of heat into the ambient air or a thermally conductive structure comprising a plurality of fins extending from an outer surface thereof to facilitate convection heat transfer from air within the enclosure to ambient air external to the enclosure.

10. A method of facilitating cooling of an electronics rack, the method comprising:

providing at least one heat extraction mechanism for facilitating cooling of an electronics rack disposed within an enclosure, wherein the enclosure facilitates establishing a closed loop airflow path passing through the electronics rack, the at least one heat extraction mechanism comprising at least one liquid-cooled cold plate coupled to at least one heat-generating component within the electronics rack;

providing a heat removal unit disposed external to the enclosure and in fluid communication with the at least one heat extraction mechanism within the enclosure for removing heat from liquid coolant passing therethrough, the at least one heat extraction mechanism and the heat removal unit being coupled via a liquid coolant loop, wherein the heat removal unit comprises a liquid-to-air heat exchanger, a coolant pump and an air-moving device, the liquid-to-air heat exchanger removing heat from the liquid coolant within the liquid coolant loop before passing through the at least one heat extraction mechanism, the coolant pump pumping the liquid coolant through the liquid coolant loop, and the air-moving device moving air across the liquid-to-air heat exchanger; and providing a control unit to automatically adjust liquid coolant flow rate through the at least one heat extraction mechanism, the control unit automatically dynamically controlling and minimizing energy consumption of the heat removal unit while achieving a specified level of cooling of the electronics rack employing the liquid coolant passing through the at least one heat extraction mechanism within the enclosure, wherein the control unit is coupled to the coolant pump via a first variable frequency drive and is coupled to the air-moving device via a second variable frequency drive, and wherein the control unit dynamically adjusts energy consumption of the heat removal unit by:

determining thermal resistance (R) of the at least one liquid-cooled cold plate, initially setting RPMs of the coolant pump via the first variable frequency drive using a first pre-generated relation relating thermal resistance (R) of the at least one liquid-cooled cold plate to coolant pump RPMs; and subsequently setting RPMs of the air-moving device via the second variable frequency drive using a second pre-generated relation relating a target liquid coolant inlet temperature of the at least one liquid-cooled cold plate and the coolant pump RPMs to air-moving device RPMs.

11. The method of claim 10, wherein providing the at least one heat extraction mechanism comprises providing at least one air-to-liquid heat exchange assembly for facilitating air-cooling of the electronics rack, the at least one air-to-liquid heat exchange assembly being disposed within the enclosure with the closed loop airflow path passing therethrough, the at least one air-to-liquid heat exchange assembly cooling air circulating through the closed loop airflow path, and wherein the control unit automatically adjusts the liquid coolant flow rate through the at least one air-to-liquid heat exchange assembly employing, in part, a target air inlet temperature to an air inlet side of the electronics rack.

12. The method of claim 11, wherein the at least one liquid-cooled cold plate and the at least one air-to-liquid heat exchange assembly of the at least one heat extraction mechanism are serially coupled in fluid communication with the liquid coolant passing through the at least one air-to-liquid heat exchange assembly also passing through the at least one liquid-cooled cold plate, and wherein the control unit automatically adjust the liquid coolant flow rate employing, in part, the target liquid coolant inlet temperature to the at least one liquid-cooled cold plate.

13. The method of claim 10, wherein the control unit is coupled to the heat removal unit for dynamically adjusting energy consumption of the heat removal unit to minimize energy consumption thereof while providing the required cooling to the electronics rack, wherein the required cooling comprises at least one of a target air inlet temperature to the electronics rack at an air inlet side thereof, and the target liquid coolant inlet temperature to the at least one liquid-cooled cold plate disposed within the electronics rack.

14. The method of claim 10, wherein the control unit receives as input for automatically controlling and minimizing energy consumption of the heat removal unit a required liquid-cooled cold plate heat dissipation (q), a required rack heat load to be removed via the liquid-cooled cold plate ($Q_w$), a required rack heat load to be removed via a recirculating air flow within the enclosure ($Q_a$), an airflow rate through the electronics rack (F), a thermal conductance of an air-to-liquid heat exchanger of the at least one heat extraction mechanism (UA), a required heat-generating component temperature ($T_j$), the target liquid coolant inlet temperature of the at least one liquid-cooled cold plate ($T_{5, reqd}$), and a target air inlet temperature of the electronics rack containing the at least one heat-generating component ($T_{7\ reqd}$).

15. The method of claim 14, wherein after initially setting RPMs of the coolant pump, and before setting RPMs of the air-moving device, the control unit determines whether an adjustment to the coolant pump RPMs is required by comparing a calculated heat exchange capability of an air-to-liquid heat exchanger of the at least one heat extraction mechanism ($Q_{est}$) with the required rack heat load to be removed via the recirculating airflow within the enclosure ($Q_a$).

16. A method for cooling an electronics rack, the method comprising:
passing liquid coolant through at least one heat extraction mechanism disposed within an enclosure containing the electronics rack for facilitating cooling of the electronics rack, wherein the enclosure surrounds the electronics rack and facilitates defining a closed loop airflow path through the electronics rack, the at least one heat extraction mechanism comprising at least one liquid-cooled cold plate coupled to at least one heat-generating component within the electronics rack; and
dynamically adjusting energy consumption of a heat removal unit coupled in fluid communication with the at least one heat extraction mechanism via a liquid coolant loop, the heat removal unit removing heat from the liquid coolant passing therethrough, wherein the heat removal unit comprises a liquid-to-air heat exchanger, a coolant pump and an air-moving device, the liquid-to-air heat exchanger removing heat from the liquid coolant within the liquid coolant loop before passing through the at least one heat extraction mechanism, the coolant pump pumping the liquid coolant through the liquid coolant loop, and the air-moving device moving air across the liquid-to-air heat exchanger;
wherein the dynamically adjusting comprises employing a control unit to dynamically adjust a liquid coolant flow rate through the at least one heat extraction mechanism and an air flow rate across at least one liquid-to-air heat exchanger of the heat removal the heat removal unit being disposed external to the enclosure, and wherein the control unit is coupled to the coolant pump via a first variable frequency drive and is coupled to the air-moving device via a second variable frequency drive, and wherein the control unit dynamically adjusts energy consumption of the heat removal unit by:
determining thermal resistance (R) of the at least one liquid-cooled cold plate;
initially setting RPMs of the coolant pump via the first variable frequency drive using a first pre-generated relation relating thermal resistance (R) of the at least one liquid-cooled cold plate to coolant pump RPMs; and
subsequently setting RPMs of the air-moving device via the second variable frequency drive using a second pre-generated relation relating a target liquid coolant inlet temperature of the at least one liquid-cooled cold plate and the coolant pump RPMs to air-moving device RPMs.

17. The method of claim 16, wherein the at least one heat extraction mechanism comprises at least one air-to-liquid heat exchange assembly for facilitating air-cooling of the electronics rack, the at least one air-to-liquid heat exchange assembly being disposed within the enclosure to cool air circulating through the closed loop airflow path, and wherein the dynamically adjusting comprises dynamically adjusting at least one of the liquid coolant flow rate through the at least one air-to-liquid heat exchange assembly and an airflow rate across the at least one liquid-to-air heat exchanger of the heat removal unit employing, in part, a target air inlet temperature to an air inlet side of the electronics rack within the enclosure.

18. The method of claim 17, wherein the at least one liquid-cooled cold plate and the at least one air-to-liquid heat exchange assembly of the at least one heat extraction mechanism are serially coupled in fluid communication with the liquid coolant passing through the at least one air-to-liquid heat exchange assembly also passing through the at least one liquid-cooled cold plate, and wherein the dynamically adjusting further comprises dynamically adjusting at least one of the liquid coolant flow rate through the at least one liquid-cooled cold plate and the airflow rate across the at least one liquid-to-air heat exchanger of the heat removal unit employing, in part, a the target liquid coolant inlet temperature into the at least one liquid-cooled cold plate for cooling the at least one heat-generating component.

19. The method of claim 18, wherein the method further comprises sensing an air temperature into the electronics rack at an air inlet side thereof, sensing a liquid coolant inlet temperature into the at least one liquid-cooled cold plate, and sensing a temperature of inlet air moving across the at least one liquid-to-air heat exchanger of the heat removal unit, and employing the sensed temperatures in automatically adjusting operation of the liquid coolant pump of the heat removal unit.

20. The method of claim 19, wherein the dynamically adjusting further comprises automatically adjusting a frequency of operation of an air-moving device, disposed to move air across the at least one liquid-to-air heat exchanger, to provide sufficient cooling of the liquid coolant passing through the at least one liquid-to-air heat exchanger to achieve a required cooling of the electronics rack while minimizing energy consumption of the heat removal unit, including minimizing energy consumption of the liquid coolant pump and the air-moving device.

* * * * *